US008644084B2

(12) United States Patent
Park

(10) Patent No.: US 8,644,084 B2
(45) Date of Patent: Feb. 4, 2014

(54) MEMORY SYSTEM SUPPORTING INPUT/OUTPUT PATH SWAP

(75) Inventor: Kwang-Soo Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 353 days.

(21) Appl. No.: 13/215,293

(22) Filed: Aug. 23, 2011

(65) Prior Publication Data

US 2012/0063240 A1 Mar. 15, 2012

(30) Foreign Application Priority Data

Sep. 14, 2010 (KR) ........................ 10-2010-0090185

(51) Int. Cl.
*G11C 7/10* (2006.01)

(52) U.S. Cl.
USPC ................. 365/189.03; 365/189.17; 365/214

(58) Field of Classification Search
USPC .............................. 365/189.03, 189.17, 214
See application file for complete search history.

(56) References Cited

U.S. PATENT DOCUMENTS

| 8,395,959 | B2* | 3/2013 | Niimi .................... 365/230.03 |
| 2005/0157550 | A1* | 7/2005 | Ishii et al. ................ 365/185.01 |
| 2005/0190624 | A1* | 9/2005 | Kasai ........................ 365/222 |
| 2007/0047373 | A1* | 3/2007 | Niimi .................... 365/230.06 |
| 2008/0151670 | A1* | 6/2008 | Kawakubo et al. ......... 365/222 |
| 2012/0134217 | A1* | 5/2012 | Fujisawa et al. ......... 365/189.05 |

FOREIGN PATENT DOCUMENTS

| JP | 2000-340737 | 12/2000 |
| JP | 2003-059262 | 2/2003 |
| KR | 1020010055780 A | 7/2001 |

\* cited by examiner

*Primary Examiner* — Tuan T. Nguyen
(74) *Attorney, Agent, or Firm* — Volentine & Whitt, PLLC

(57) ABSTRACT

A memory system includes a controller having first and second input/output terminals, and first and second memory devices each having first and second input/output terminals. The system includes a path selection mechanism for selectively employing one of the first and second terminals of either the controller or the first memory device for communicating a first input/output signal between the controller and the first memory device, and employing the other one of the first and second terminals for communicating a second input/output signal between the controller and the first memory device. The path selection mechanism selectively employs the first and second terminals in accordance with data indicating which of the first and second terminals of the first memory device is connected to the first terminal of the controller and which of the first and second terminals of the first memory device is connected to the second terminal of the controller.

20 Claims, 10 Drawing Sheets

MEMORY SYSTEM SUPPORTING INPUT/OUTPUT PATH SWAP

CROSS-REFERENCE TO RELATED APPLICATIONS

This U.S. non-provisional patent application claims priority under 35 U.S.C. §119 from Korean Patent Application No. 10-2010-0090185, filed on Sep. 14, 2010, the entire contents of which are hereby incorporated by reference.

BACKGROUND

The present inventive concept herein relates to memory systems, and more particularly, to a memory system including a plurality of memory devices.

As memory devices process huge amounts of data, semiconductor memory devices having a high integration are being required. To apply a high integration semiconductor memory device to a system, the following methods are used. First, one package including a high density single chip or a high density multi chip is used. Second, a plurality of packages each including a low density chip is used.

To realize a higher capacity memory device such as a solid state disk (SSD), it may be required that a plurality of packages including a high density multi chip is connected to one channel. In this case, when a plurality of packages is mounted on a printed circuit board (PCB), interconnections between input terminals become complex and long and thereby there may be a lot of cross-talks between input terminals and signal integrity (SI) may be deteriorated.

SUMMARY

Embodiments of the inventive concept provide a memory system. The memory system may include a first memory device, a second memory device and a controller. The memory device may have first and second input/output terminals; the second memory device may have first and second input/output terminals; and the controller may have first and second input/output terminals. The first and second input/output terminals of the controller may be connected respectively to the second and first input/output terminals of the first memory device, and may be connected respectively to the first and second input/output terminals of the second memory device. The controller may be configured to rearrange input/output signals being communicated with the first memory device such that first and second input/output signals which are communicated to the second memory device via the first and second input/output terminals of the controller, respectively, are communicated to the first memory device via the second and first input/output terminals of the controller, respectively.

Other embodiments of the inventive concept also provide a memory system. The memory system may include a plurality of memory devices and a controller. Each of the memory devices may include a corresponding input/output path swap unit configured to selectively swap a first internal input/output path within the corresponding memory device for a second input/output path within the corresponding memory device. The controller may be configured to transmit a control signal and reference data to the memory devices. One of the input/output path swap units included in one of the memory devices may be configured to selectively swap the first internal input/output path within the corresponding memory device for the second input/output path within the corresponding memory device according to whether the reference data received by the one memory coincides with internal reference data stored within the one memory device.

Still further embodiments of the inventive concept may further provide a memory system. The memory system may include a controller, a first memory device and a second memory device. The controller may have first and second input/output terminals; the first memory device may have first and second input/output terminals; and the second memory device may have first and second input/output terminals. At least one of the controller and the first memory device may include path selection means for selectively employing one of the first and second terminals of one of the controller and the first memory device for communicating a first input/output signal between the controller and the first memory device and employing an other one of the first and second terminals of the one of the controller and the first memory device for communicating a second input/output signal between the controller and the first memory device. The path selection means may selectively employ the first and second terminals of the one of the controller and the first memory device in accordance with data indicating which of the first terminal and second terminal of the first memory device is connected to the first terminal of the controller and which of the first terminal and second terminal of the first memory device is connected to the second terminal of the controller.

BRIEF DESCRIPTION OF THE FIGURES

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

Figure 1:
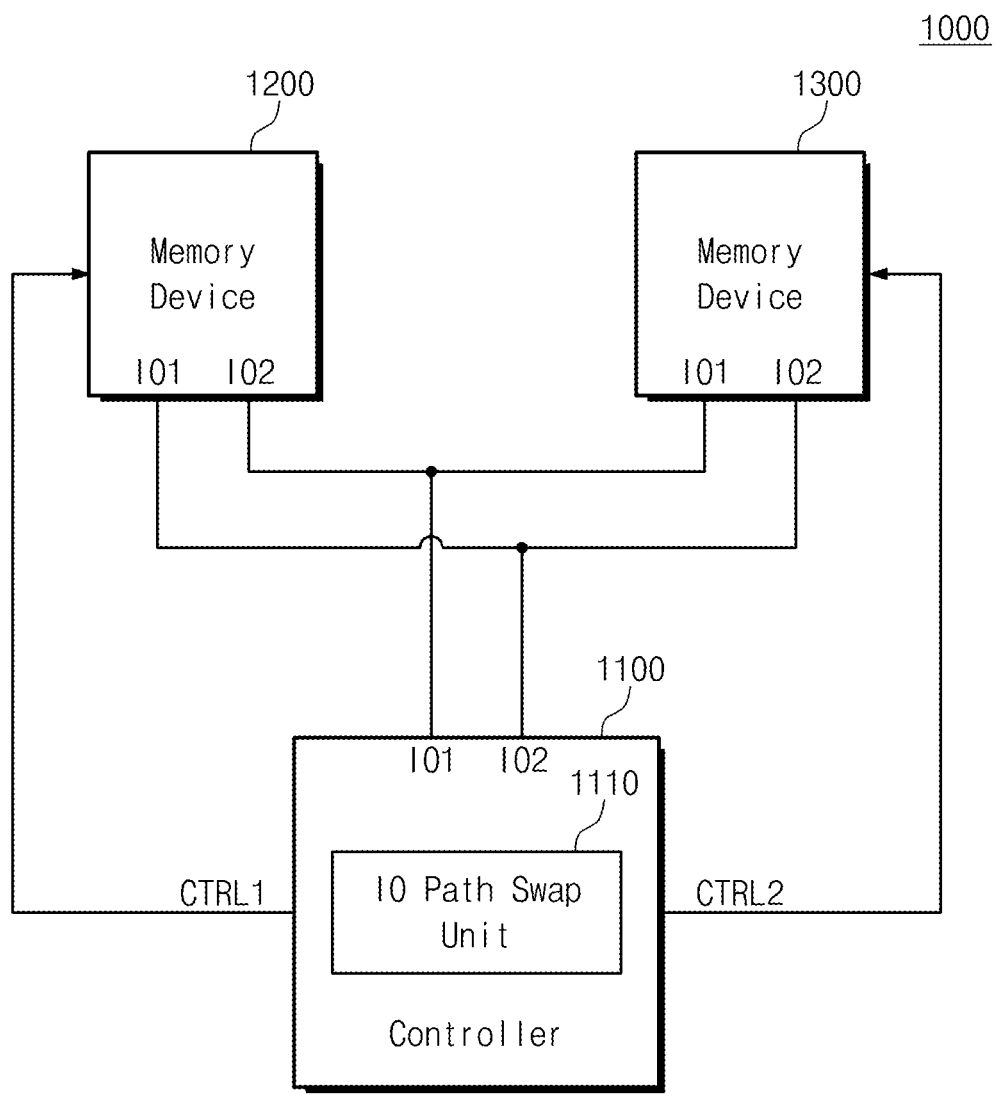
FIG. 1 is a block diagram illustrating a memory system in accordance with a first embodiment of the inventive concept.

FIG. 1 is a block diagram illustrating a memory system 1000 in accordance with a first embodiment of the inventive concept. Referring to FIG. 1, memory system 1000 may include a controller 1100 and a plurality of memory devices 1200 and 1300. For brevity of description, it is assumed that memory system 1000 includes first and second memory devices 1200 and 1300. It is also assumed that first and second memory devices 1200 and 1300 are flash memory devices. However, first and second memory devices 1200 and 1300 in accordance with exemplary embodiments of the inventive concept are not limited thereto. As an illustration, the inventive concept may be applied to nonvolatile memory devices such as ROM, PROM, EPROM, EEPROM, MRAM, PRAM, FRAM etc.

Controller 1100 transmits input/output signals to first and second memory devices 1200 and 1300 and receives input/output signals from first and second memory devices 1200 and 1300. Here, a command, an address and data are transmitted and received between controller 1100 and each of memory devices 1200 and 1300 through the input/output signals.

Although FIG. 1 shows an embodiment where first and second input/output signals may be transmitted and received between controller 1100 and memory devices 1200 and 1300, in other embodiments there may be first through Nth input/output signals, where N is natural number and N≥3).

In general, an nth input/output terminal (IOn) of controller 1100 is connected to an nth input/output terminal (IOn) of each of memory devices 1200 and 1300 to transmit and receive an nth input/output signal. However, according to exemplary embodiments of the inventive concept, input/output terminals are swapped to be connected to each other between controller 1100 and at least one of memory devices 1200 and 1300 depending on an interconnection design of a printed circuit board (PCB).

For example, a first input/output terminal (IO1) of controller 1100 is may be connected to a second input/output terminal (IO2) of first memory device 1200 and a second input/output terminal (IO2) of controller 1100 may be connected to a first input/output terminal (IO1) of the first memory device 1200.

Second memory device 1300 may have an input/output pin terminal structure that is the same as that of first memory device 1200. In one embodiment, first and second memory devices 1200 and 1300 may be mounted on a printed circuit board (PCB) in a top and bottom configuration. That is, the first and second memory devices 1200 and 1300 may be mounted on upper and lower sides of a printed circuit board (PCB) facing each other. In this case, when input/output terminals facing each other between first and second memory devices 1200 and 1300 are connected to the input/output terminal of controller 1100, the input/output terminals of controller 1100 and one of first and second memory devices 1200 and 1300 may be swapped in their connection to each other.

Hereinafter, assume that the first and second input/output terminals (IO1, IO2) are swapped with respect to each other in their connections between controller 1100 and first memory device 1200. That is, first input/output terminal (IO1) of controller 1100 is connected to second input/output terminal (IO2) of first memory device 1200, and second input/output terminal (IO2) of controller 1100 is connected to first input/output terminal (IO1) of first memory device 1200.

In this case, if controller 1100 transmits first and second input/output signals through its first and second input/output terminals (IO1, IO2), respectively, then first memory device 1200 receives the second input/output signal from the controller through the first input/output terminal (IO1) of first memory device 1200 and receives the first input/output signal from the controller through the second input/output terminal (IO2) of first memory device 1200. If first memory device 1200 transmits first and second input/output signals through the first and second input/output terminals (IO1, IO2), respectively, then controller 1100 receives the second input/output signal from first memory device 1200 through the first input/output terminal (IO1) of controller 1100 and receives the second input/output signal from first memory device 1200 through the second input/output terminal (IO2) of controller 1100.

Generally, first and second input/output signals should be transmitted and received through corresponding input/output terminals. For example, the first input/output signal should be transmitted and received through the first input/output terminal (IO1) of controller 1100 and the first input/output terminal (IO1) of first memory device 1200. The second input/output signal should be transmitted and received through the second input/output terminal (IO2) of controller 1100 and the second input/output terminal (IO2) of first memory device 1300.

However, in the case that the first and second input/output terminals (IO1, IO2)) are swapped with respect to each other in their connections between controller 1100 and first memory device 1200, a path selection means for swapping an input/output path of controller 1100 or first memory device 1200 is required.

In memory system 1000 in accordance with the first embodiment of the inventive concept, controller 1100 may include an input/output path swap unit 1110 as a path selection means for swapping an internal input/output path of controller 1100.

Input/output path swap unit 1110 swaps an internal input/output path when controller 1100 transmits first and second input/output signals to first memory device 1200 or receives the first and second input/output signals from first memory device 1200. By doing so, although the connection between controller 1100 and first memory device 1200 is swapped so that the first input/output terminal (IO1) of controller 1100 is connected to the second input/output terminal (IO2) of first memory device 1200, and the second input/output terminal (IO2) of controller 1100 is connected to the first input/output terminal (IO1) of first memory device 1200, controller 1100 and first memory device 1200 may perform a normal operation. The structure and an operation of an embodiment of input/output path swap unit 1110 are described in detail with reference to FIG. 2.

Controller 1100 generates a first control signal (CTRL1) to control first memory device 1200 and a second control signal (CTRL2) to control second memory device 1300. Each of the first and second control signals (CTRL1, CTRL2) may include a chip enable signal (CE), a command latch enable signal (CLE), an address latch enable signal (AIE), a write enable signal (WE) etc.

First and second memory device 1200 and 1300 operate according to a control of the controller 1100. That is, first and second memory devices 1200 and 1300 operate in response to the first and second control signals (CTRL1, CTRL2) respectively. For example, first and second memory devices 1200 and 1300 may perform read, write and erasure operations in response to the first and second control signals (CTRL1, CTRL2) respectively.

Figure 2:
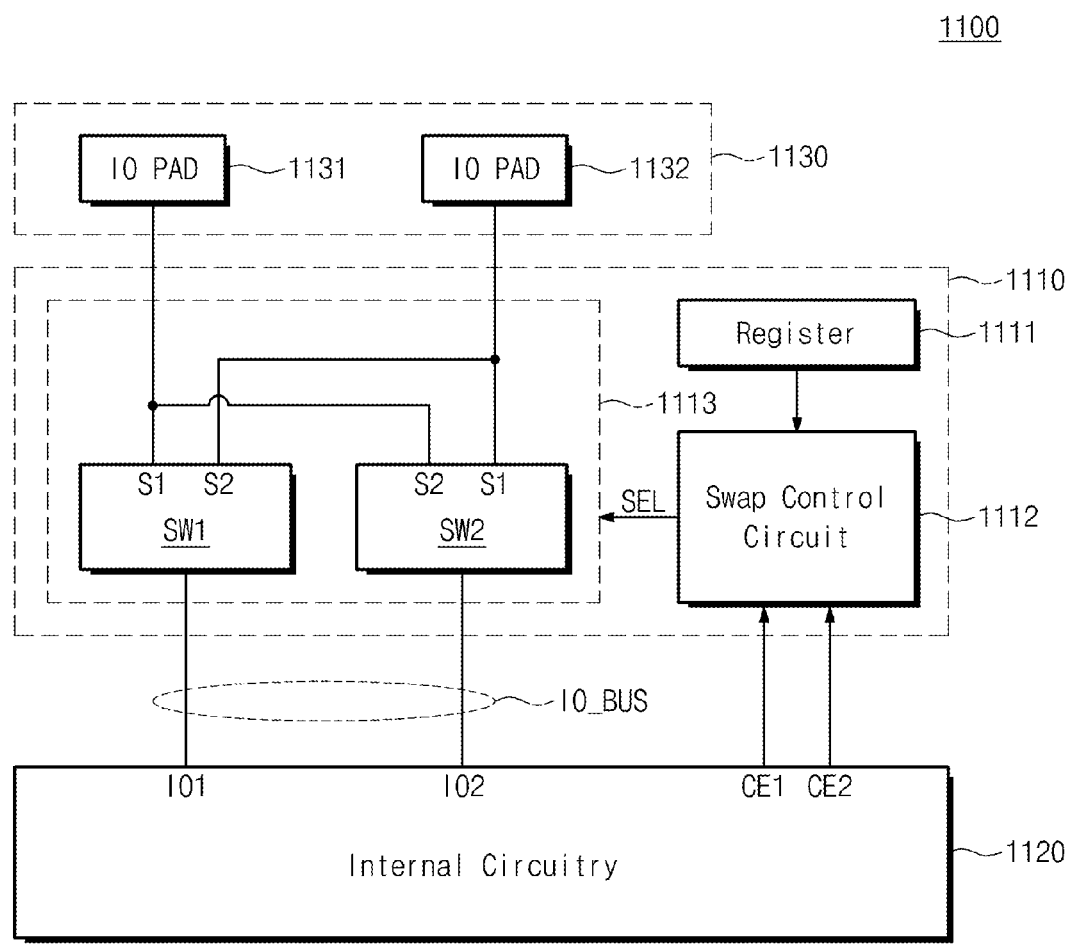
FIG. 2 is a block diagram illustrating a controller illustrated in FIG. 1.

FIG. 2 is a block diagram illustrating a controller illustrated in FIG. 1. Referring to FIG. 2, controller 1100 may include an input/output path swap unit 1110, an internal circuit 1120 and an input/output pad unit 1130.

Input/output path swap unit 1110 may include a register 1111, a swap control circuit 1112 and a path select circuit 1113.

Register 1111 stores information (hereinafter it is referred to "routing state information") showing a connection state between controller 1100 and each of memory devices 1200 and 1300. That is, the routing state information stored in register 1111 represents whether or not each of memory devices 1200 and 1300 includes input/output terminals whose connections to input/output terminals of controller 1100 are swapped.

Swap control circuit 1112 generates a select signal (SEL) in response to a first chip enable signal (CE1) controlling an access to first memory device 1200 and a second chip enable signal (CE2) controlling an access to second memory device 1300. At this time, swap control circuit 1112 refers to the routing state information stored in the register 1111.

Swap control circuit 1112 sets up a logic level of the select signal (SEL) based on responding to one of the first and second chip enable signals CE1 and CE2 with reference to the routing state information.

Path select circuit 1113 is connected to internal circuit 1120 through an input/output bus (IO_BUS). Path select circuit 1113 is also connected to the input/output pad unit 1130 including first and second input/output pads 1131 and 1132.

Path select circuit 1113 selects a first internal input/output path or a second internal input/output path between internal circuit 1120 and input/output pad unit 1130 in response to the select signal (SEL) received from the swap control circuit 1112. Herein, the first internal input/output path is set so that a first input/output terminal (IO1) of internal circuit 1120 is connected to first input/output pad 1131 and a second input/output terminal (IO2) of internal circuit 1120 is connected to second input/output pad 1132. The second internal input/output path is set so that the first input/output terminal (IO1) of internal circuit 1120 is connected to second input/output terminal 1132 and the second input/output terminal (IO2) of internal circuit 1120 is connected to first input/output terminal 1131.

Path select circuit 1113 may include a first switch (SW1) and a second switch (SW2). The first switch (SW1) selectively connects the first input/output terminal (IO1) of internal circuit 1120 to first input/output pad 1131 or second input/output pad 1132 depending on a switching mode. For example, the first switch (SW1) connects the first input/output terminal (IO1) of internal circuit 1120 to first input/output pad 1131 in a first switching mode (S1), and connects the first input/output terminal (IO1) of internal circuit 1120 to second input/output pad 1132 in a second switching mode (S2).

The second switch (SW2) selectively connects the second input/output terminal (IO2) of internal circuit 1120 to first input/output pad 1131 or second input/output pad 1132 depending on the switching mode. For example, the second switch (SW2) connects the second input/output terminal (IO2) of internal circuit 1120 to second input/output pad 1132 in the first switching mode (S1), and connects the second input/output terminal (IO2) of internal circuit 1120 to first input/output pad 1131 in the second switching mode (S2).

The switching mode of the first and second switches (SW1, SW2) is set depending on a logic level of the select signal (SEL). For example, in one embodiment if the select signal (SEL) is in a low level state, the first and second switches (SW, SW2) are set to the first switching mode (S1). If the select signal (SEL) is in a high level state, the first and second switches (SW, SW2) are set to the second switching mode (S2).

Consequently, if the first and second switches (SW1, SW2) are set to the first switching mode (S1), path select circuit 1113 selects the first internal input/output path. If the first and second switches (SW1, SW2) are set to the second switching mode (S2), path select circuit 1113 selects the second internal input/output path.

Internal circuit 1120 may include all the constituent elements of controller 1100 except input/output path swap unit 1110 and input/output pad unit 1130. For example, although not illustrated in the drawing, internal circuit 1120 may include a micro processor, a buffer memory, a control signal generator, an input/output signal generator, etc.

Input/output pad unit 1130 may include first and second input/output pads 1131 and 1132. First and second input/output pads 1131 and 1132 are each connected to a corresponding external input/output terminal.

As described above, according to a first embodiment of the inventive concept, when transmitting and receiving input/output signals, the controller swaps the internal input/output path with reference to routing state information. Thus, even when input/output terminals of the controller and input/output terminals of the memory device are swapped to be connected to each other, transmission/reception between the controller and the memory device may be normally done.

Figure 3:
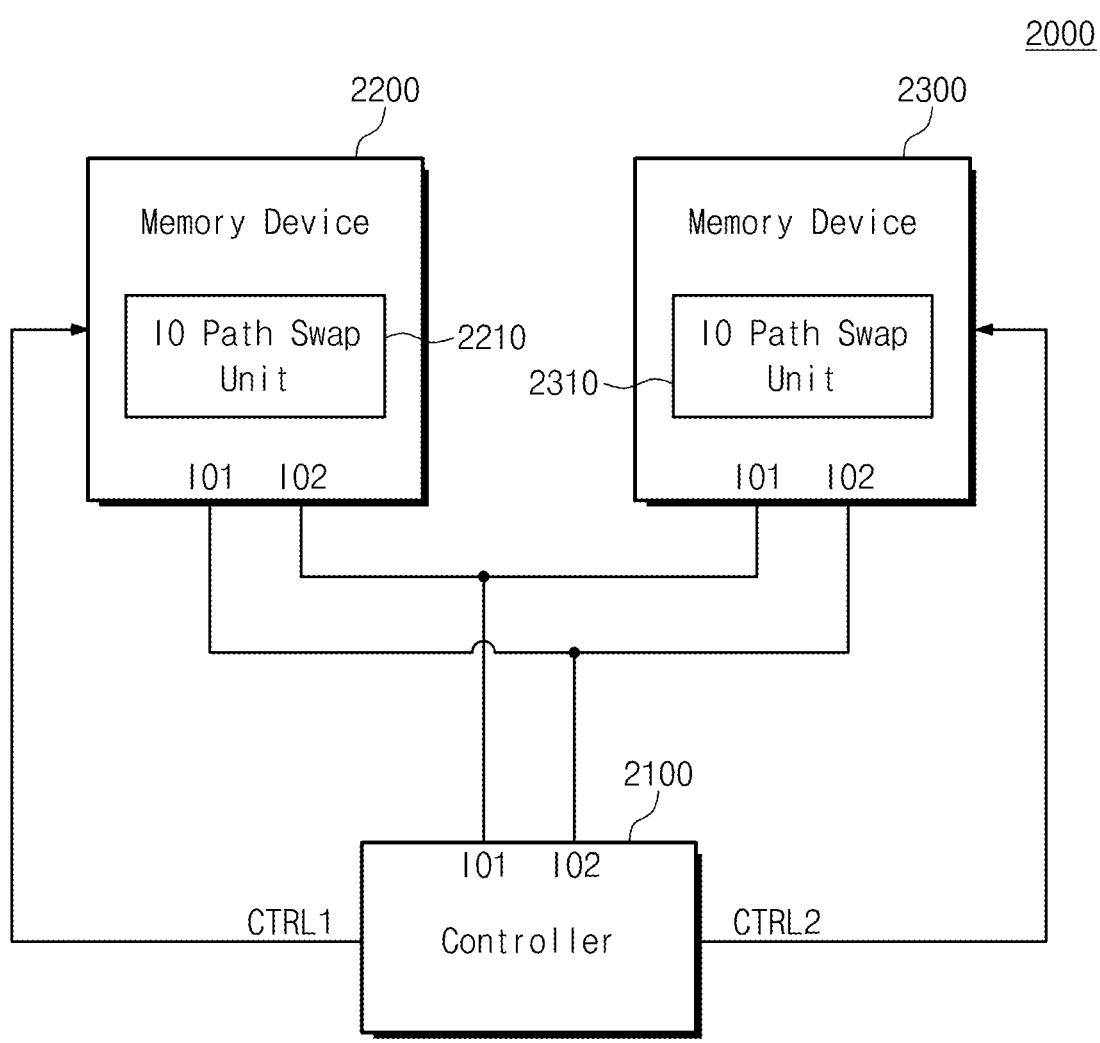
FIG. 3 is a block diagram illustrating a memory system in accordance with a second embodiment of the inventive concept.

FIG. 3 is a block diagram illustrating a memory system 2000 in accordance with a second embodiment of the inventive concept. Referring to FIG. 3, memory system 2000 may include a controller 2100 and a plurality of memory devices 2200 and 2300. For brevity of description, assume that memory system 2000 includes first and second memory devices 2200 and 2300. However, the inventive concept may be applied to a memory system including three or more memory devices.

In memory system 2000 in accordance with the second embodiment of the inventive concept, first memory device 2200 include a first input/output path swap unit 2210 as a path selection means and second memory device 2300 includes a second input/output path swap unit 2310 as a path selection means for.

Since a structure and an operation of first and second memory devices 2200 and 2300 are the same as each other, for brevity a description of second memory device 2200 is omitted. Thus, a description of second input/output path swap unit 2310 included in second memory device 2200 is omitted.

Controller 2100 transmits reference data to first memory device 2200 in synchronization with at least one enable signal included in a first control signal CTRL. Herein, the reference data has a value predetermined in controller 2100 and first memory device 2200.

After that, first input/output path swap unit 2210 determines whether or not an internal input/output path is to be swapped according to whether the reference data (hereinafter it is referred to as "received reference data") received by first memory device 2200, and internal reference data stored in first memory device 2200, coincide or not.

If the received reference data coincides with the internal reference data, input/output path swap unit 2210 maintains the normal (unswapped) internal input/output path. If the received reference data does not coincide with the internal reference data, input/output path swap unit 2210 swaps the internal input/output path.

In operation controller 2210 transmits the reference data and first memory device 2200 compares the received reference data with the internal reference data to determine whether or not the internal input/output path may be swapped when memory system 2000 is booted or reset.

By doing so, even when the first and second input/output terminals (IO1, IO2) are swapped between controller 2100 and first memory device 2200, controller 2100 and first memory device 2200 may perform a normal operation. Input/output path swap unit 2210 is described in detail with reference to FIGS. 4 through 6.

Figure 4:
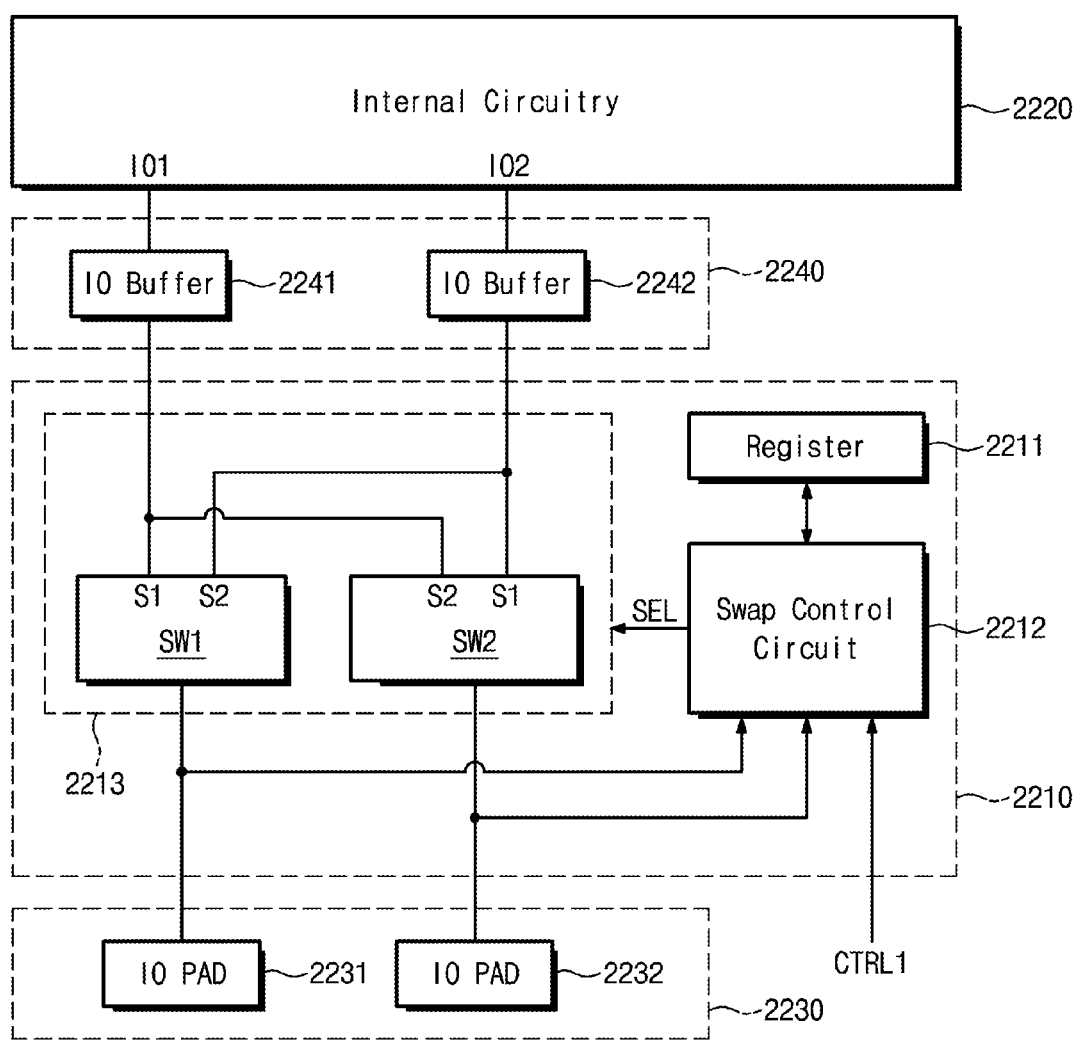
FIGS. 4 and 5 are block diagrams illustrating a memory device illustrated in FIG. 3.
Figure 5:
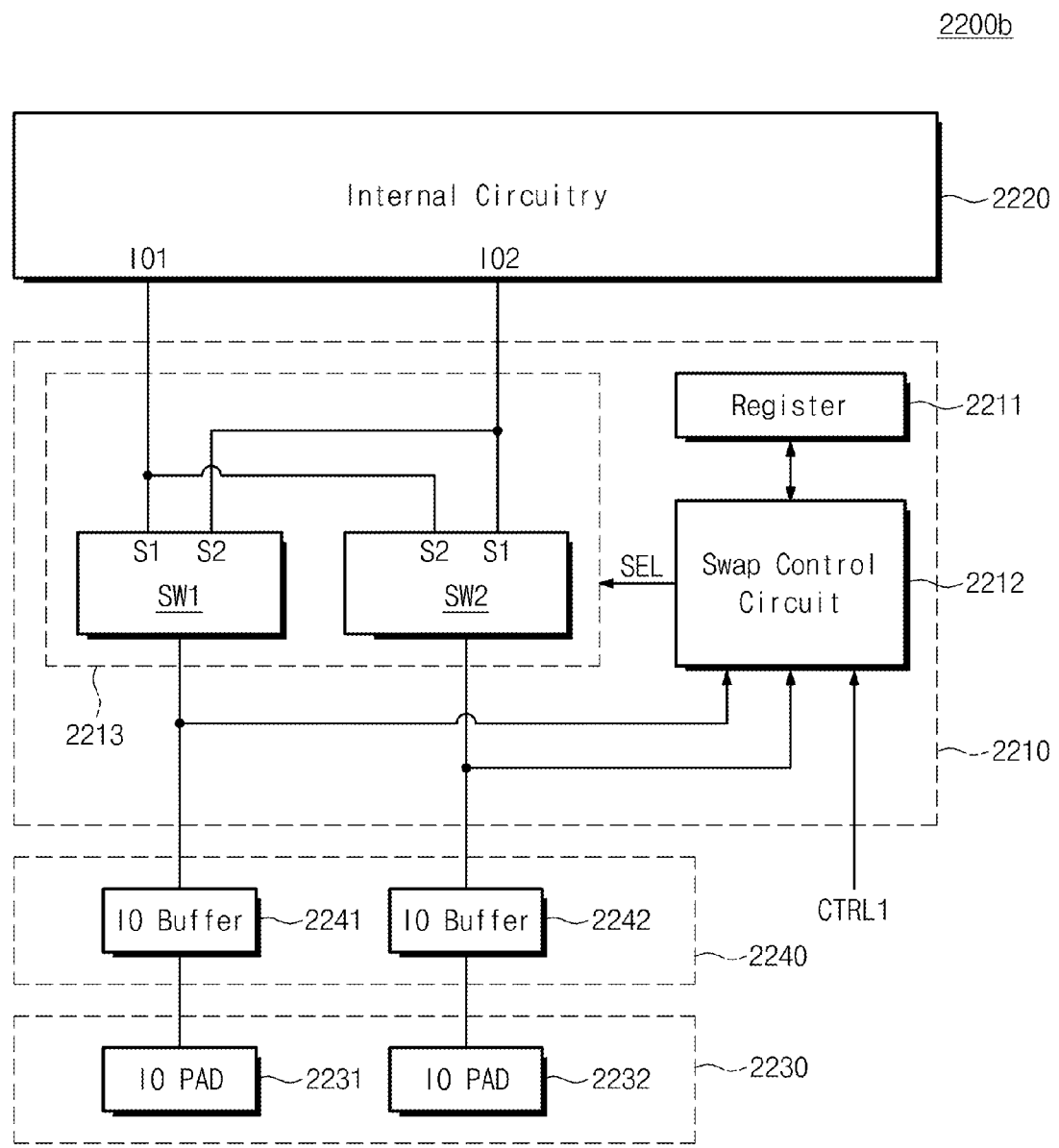

FIGS. 4 and 5 are block diagrams illustrating a memory device illustrated in FIG. 3. Referring to FIG. 4, a memory device 2200*a* may include an input/output path swap unit 2210, an internal circuit 2220, an input/output pad unit 2230 and an input/output buffer unit 2240.

Input/output path swap unit 2210 may include a register 2211, a swap control circuit 2212 and a path select circuit 2213.

Register 2211 stores and maintains state information (hereinafter it is referred to as "select information") of a select signal (SEL) generated from swap control circuit 2212. For example, the select information corresponds to a logic level of the select signal (SEL).

Swap control circuit 2212 generates the select signal (SEL) in response to a control signal (CTRL1). At this time, swap control circuit 2212 sets a logic level of the select signal (SEL) depending on whether received reference data from input/output pad unit 2230 and internal reference data coincide or not. For example, in one embodiment if the internal reference data is '01' and the received reference data is '01', a logic level of the select signal (SEL) is set to a logic level to maintain an internal input/output path in a normal (unswapped) state. If the internal reference data is '01' and the received reference data is '10', a logic level of the select signal (SEL) is set to a logic level to swap the internal input/output path.

Swap control circuit 2212 generates the select signal (SEL), and then stores select information corresponding to a logic level of the select signal (SEL) in register 2211. After that, swap control circuit 2212 maintains the select signal (SEL) to the logic level corresponding to the select information stored in register 2211.

Received reference data to be compared with the internal reference data to set a logic level of the select signal (SEL) is received in synchronization with at least one enable signal included in the control signal (CTRL1). This is described in further detail with reference to FIG. 6.

Path select circuit 2213 is connected to input/output pad unit 2230 including first and second input/output pads 2231 and 2232. Path select circuit 2213 is connected to input/output buffer unit 2240 including first and second input/output buffers 2241 and 2242.

Path select circuit 2213 selects a first internal input/output path or a second internal input/output path between input/output pad unit 2230 and input/output buffer unit 2240 in response to the select signal (SEL) received from swap control circuit 2212. That is, path select circuit 2213 maintains a first internal input/output path or is swapped to a second internal input/output path depending on a logic level of the select signal (SEL).

Herein, the first internal input/output path is set by connecting first input/output pad 2231 and first input/output 2241 and connecting second input/output pad 2232 and second input/output buffer 2242. The second internal input/output path is set by connecting first input/output pad 2231 and the second input/output buffer 2242 and connecting second input/output pad 2232 and first input/output buffer 2241.

Path select circuit 2213 may include first and second switches (SW1, SW2). The first switch (SW1) selectively connects first input/output pad 2231 to first input/output buffer 2241 or second input/output buffer 2242 depending on a switching mode. For example, in one embodiment the first switch (SW1) may connect first input/output pad 2231 to first input/output buffer 2241 in a first switching mode (S1), and may connect first input/output pad 2231 to second input/output buffer 2242 in a second switching mode (S2).

The second switch (SW2) selectively connects second input/output pad 2232 to first input/output buffer 2241 or second input/output buffer 2242 depending on the switching mode. For example, in one embodiment the second switch (SW2) connects second input/output pad 2232 to second input/output buffer 2242 in the first switching mode (S1), and connects second input/output pad 2232 to first input/output buffer 2241 in the second switching mode (S2).

The switching mode of the first and second switches (SW1, SW2) is set according to a logic level of the select signal (SEL). For example, if the select signal (SEL) is in a low level state, the first and second switches (SW1, SW2) are set to the first switching mode (S1). If the select signal (SEL) is in a high level state, the first and second switches (SW1, SW2) are set to the second switching mode (S2).

Consequently, if the first and second switches (SW1, SW2) are set to the first switching mode (S1), path select circuit 2213 selects the first internal input/output path. If the first and second switches (SW1, SW2) are set to the second switching mode (S2), path select circuit 2213 selects the second internal input/output path.

Internal circuit 2220 includes all the constituent elements of memory device 2200*a* except input/output path swap unit 2210, input/output pad unit 2230 and input/output buffer unit 2240. For example, although not illustrated in the drawing, internal circuit 2220 may include a memory cell array, an address decoder, a control logic circuit, etc.

Input/output pad unit 2230 may include first and second input/output pads 2231 and 2232. First and second input/output pads 2231 and 2232 are each connected to a corresponding external input/output terminal.

Input/output buffer unit 2240 may include first and second input/output buffers 2241 and 2242. First and second input/output buffers 2241 and 2242 are connected to first and second input/output terminals (IO1, IO2) of internal circuit 2220 respectively.

Referring to FIG. 5, a memory device 2200*b* may include the input/output path swap unit 2210, internal circuit 2220, input/output pad unit 2230 and input/output buffer unit 2240. Unlike the embodiment illustrated in FIG. 4. In FIG. 5 the input/output path swap unit 2210 is connected between internal circuit 2220 and input/output buffer unit 2240, and input/output pad unit 2230 is connected to input/output buffer unit 2240. Otherwise, the structure and operation of memory device 2200*b* are the same as the structure and the operation described with reference to FIG. 4. Therefore, the description of common features already discussed with respect to memory device 2200*a* illustrated in FIG. 4 is omitted.

As described above, according to the second embodiment of the inventive concept, the memory device swaps the internal circuit with reference to the reference data being received from the controller. Thus, even when input/output terminals of the controller and input/output terminals of the memory device are swapped to be connected to each other, a transmission and reception of input/output signals between the controller and the memory device may be normally done.

Figure 6:
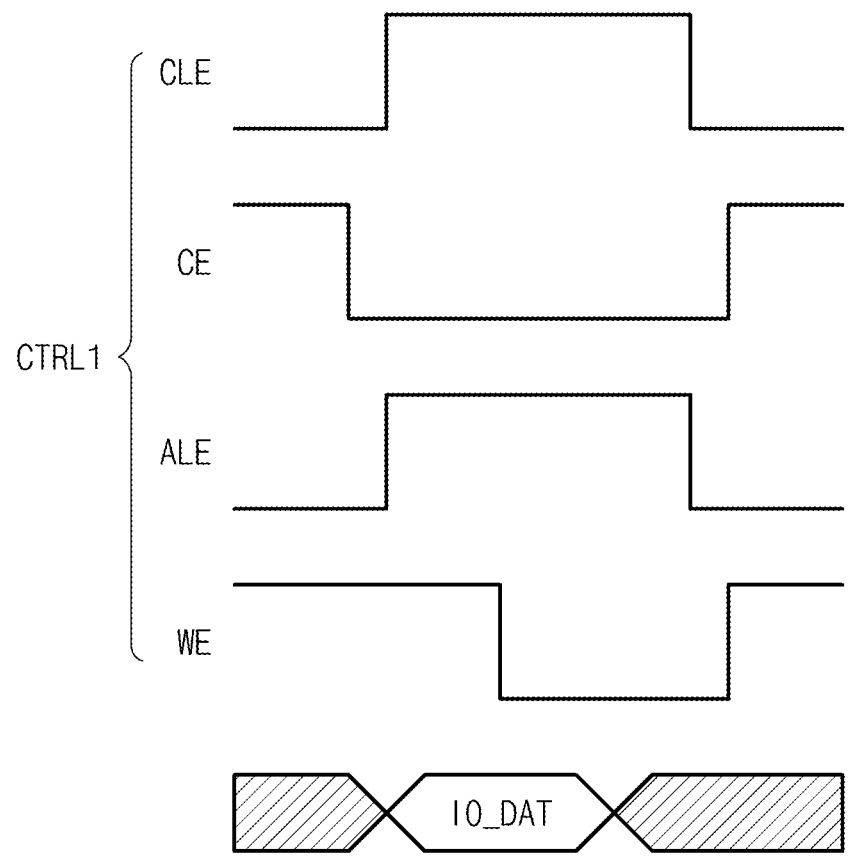
FIG. 6 is a timing diagram for explaining a method of receiving and transmitting receiving reference data.

FIG. 6 is a timing diagram for explaining a method of receiving and transmitting the received reference data. Referring to FIG. 6, a control signal (CTRL1) may include a chip enable signal (CE), a command latch enable signal (CLE), an address latch enable signal (ALE) and a write enable signal (WE).

Received reference data (IO_DAT) is received in synchronized with at least one of the chip enable signal (CE), the command latch enable signal (CLE), the address latch enable signal (ALE) and the write enable signal (WE). For example, the received reference data (IO_DAT) may be input/output data being received in synchronized with a falling edge of the write enable signal (WE) when the command latch enable signal (CLE) and the address latch enable signal (ALE) are in a high level state.

Figure 7:
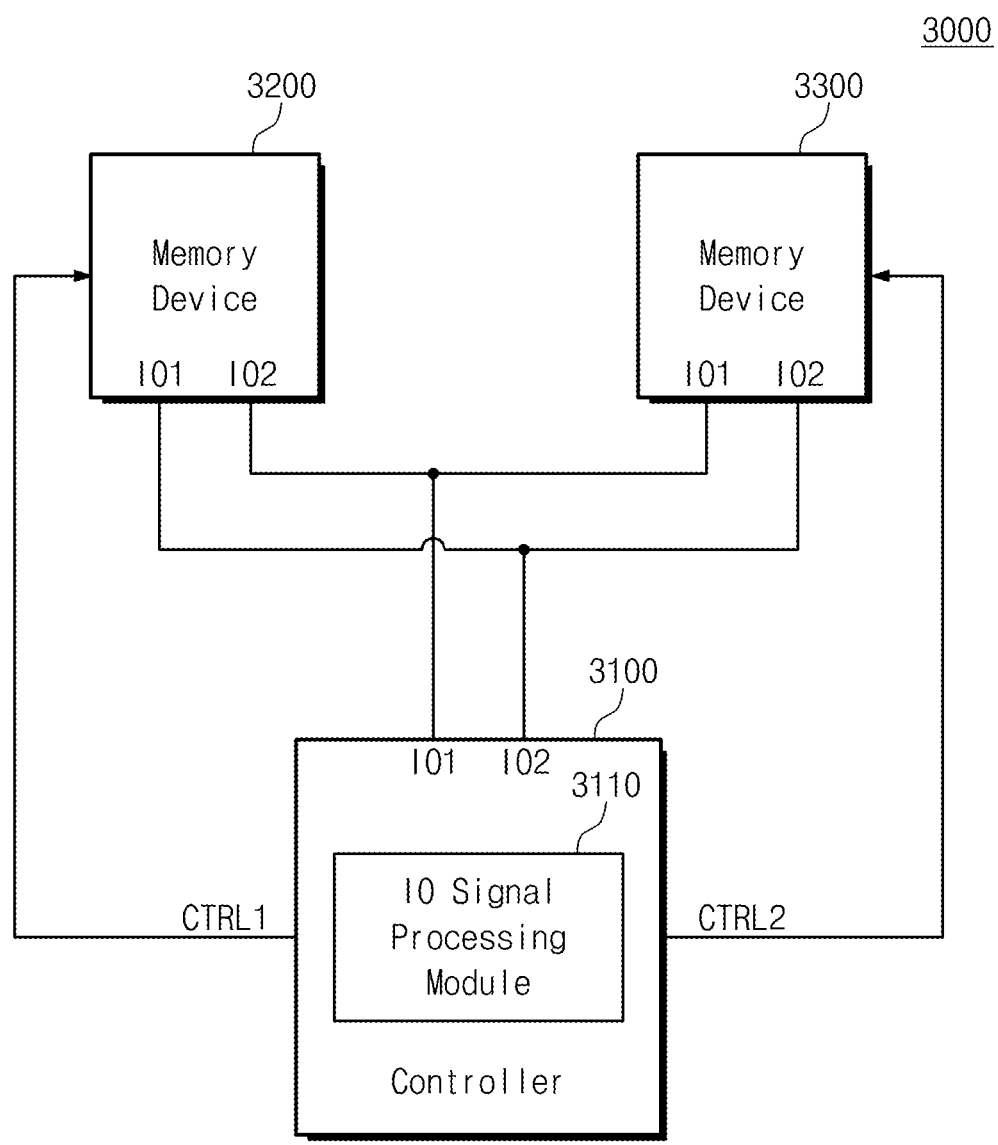
FIG. 7 is a block diagram illustrating a memory system in accordance with a third embodiment of the inventive concept.

FIG. 7 is a block diagram illustrating a memory system 3000 in accordance with a third embodiment of the inventive concept. Referring to FIG. 7, memory system 3000 may include a controller 3100 and a plurality of memory devices 3200 and 3300. For brevity of description, assume that the memory system 3000 includes first and second memory devices 3200 and 3300. Also, hereinafter, the description of common features already discussed in the memory system 1000 illustrated in FIG. 1 is omitted.

In memory system 3000 in accordance with the third embodiment of the inventive concept, controller 3100 may include an input/output signal processing module 3110 as a path selection means. Input/output signal processing module 3110 may be embodied in a portion of firmware to drive controller 3100.

Input/output signal processing module 3110 has device connection information indicating whether input/output terminals of one of first and second memory devices 3200 and 3300 are swapped for connection to controller 3100. Input/output signal processing module 3110 also has swap table information indicating a swap relationship between the input/output terminals.

With reference to the device connection information and the swap table information, input/output signal processing module 3110 swaps first and second input/output signals being transmitted to first memory device 3200 and being received from first memory device 3200 in a case where first and second input/output terminals (IO1, IO2) of first memory device 3200 are swapped to be connected to controller 3100. That is, input/output signal processing module 3110 swaps the first and second input/output signals, and then transmits them to first memory device 3200. Input/output signal processing module 3110 also swaps the first and second input/output signals being received from first memory device 3200.

As described above, according to the third embodiment of the inventive concept, the controller swaps the internal input/output signals with reference to the device connection information and the swap table information when transmitting and receiving the input/output signals. Thus, even when input/output terminals of the controller and input/output terminals of the memory device are swapped to be connected to each other, a transmission and reception of input/output signals between the controller and the memory device may be properly done.

The inventive concept may be applied to various products. For example, the inventive concept may be applied to not only electronic devices such as a personal computer, a digital camera, a camcorder, a cell phone, MP3, PMP, PSP or the like but also a storage device such as a memory card, a USB memory, a solid state disk (SSD) or the like.

Figure 8:
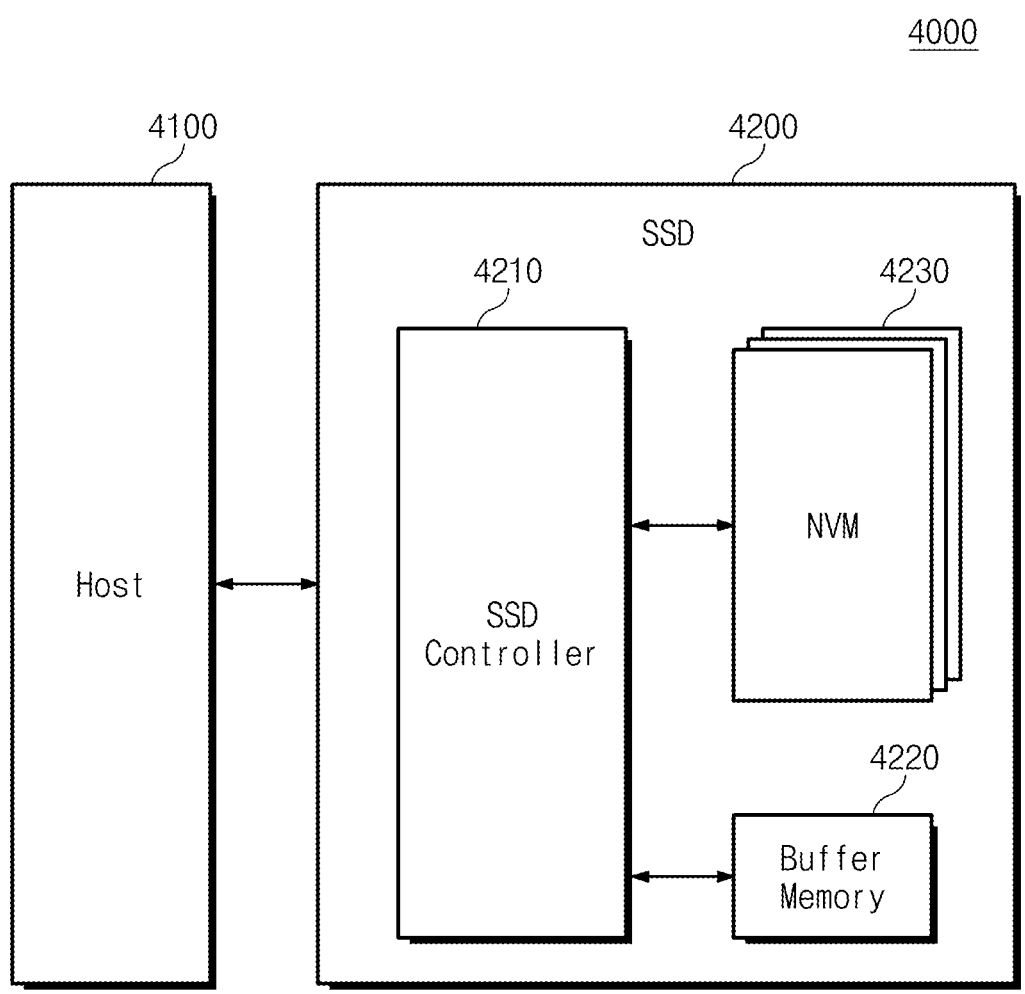
FIG. 8 is a block diagram illustrating a solid state drive (SSD) system in accordance with exemplary embodiments of the inventive concept.

FIG. 8 is a block diagram illustrating a solid state drive (SSD) system 4000 in accordance with exemplary embodiments of the inventive concept. Referring to FIG. 8, SSD system 4000 may include a host 4100 and a SSD 4200. The SSD 4200 may include a SSD controller 4210, a buffer memory 4220 and a plurality of nonvolatile memory devices 4230.

SSD controller 4210 provides an interfacing between host 4100 and the plurality of nonvolatile memory devices 4230 according to a bus format of host 4100. SSD controller 4210 decodes a command provided from host 4100. SSD controller 4210 accesses the nonvolatile memory device according to a decoding result. The bus format of host 4100 may include a universal serial bus (USB), a small computer system interface (SCSI), a PCI express, ATA, a parallel ATA, a serial ATA, a serial attached SCSI, etc.

SSD controller 4210 transmits/receives input/output signals to/from the plurality of nonvolatile memory devices 4230. At this time, a command, an address and data are transmitted and received between SSD controller 4210 and each of nonvolatile memory devices 4230 through the input/output signals.

Buffer memory 4220 temporally stores write data provided from host 4100 and data read from nonvolatile memory device 4230. In the case that data which exist in nonvolatile memory device 4230 are cached in buffer memory 4220 when a read of host 4100 is requested, buffer memory 4220 supports a function of directly providing the cached data to host 4100. A data transmission speed by the bus format (e.g., SATA or SAS) of host 4100 is much higher than a transmission speed of memory channel of the SSD 4200. That is, in the case that an interface speed of host 4100 is much higher, performance deterioration due to a speed difference may be minimized by providing buffer memory 4220 having large capacity.

Buffer memory 4220 may be embodied by a synchronous DRAM to provide a sufficient buffering in SSD 4200 used as an auxiliary memory device. However, buffer memory 4220 may not be limited thereto.

The plurality of nonvolatile memory devices 4230 may be provided as a storage medium of SSD 4200. For example, the plurality of nonvolatile memory devices 4230 may be embodied by a NAND-type flash memory having a large storage capacity. Each of the nonvolatile memory devices 4230 may be connected to SSD controller 4210 in a channel unit.

The plurality of nonvolatile memory devices 4230 as a storage medium may be embodied by a nonvolatile memory device besides a NAND-type flash memory. For example, PRAM, MRAM, ReRAM, FRAM, NOR-type flash memory, etc. may be used as a storage medium and different type memory devices may be mixed. A volatile memory device (e.g., DRAM) may be included as a storage medium.

According to exemplary embodiment of the inventive concept, input/output terminals may be swapped between SSD controller 4210 and at least one of nonvolatile memory devices 4230 to be connected to each other. In that case, SSD controller 4210, or each of nonvolatile memory devices 4230, includes an input/output path swap unit for swapping an internal input/output path. Alternatively, instead of the input/output path swap unit SSD controller 4210 may include an input/output signal processing module swapping input/output signals being transmitted to the nonvolatile memory device and being received from the nonvolatile memory device whose input/output terminals are swapped for connection to SSD controller 4210.

Figure 9:
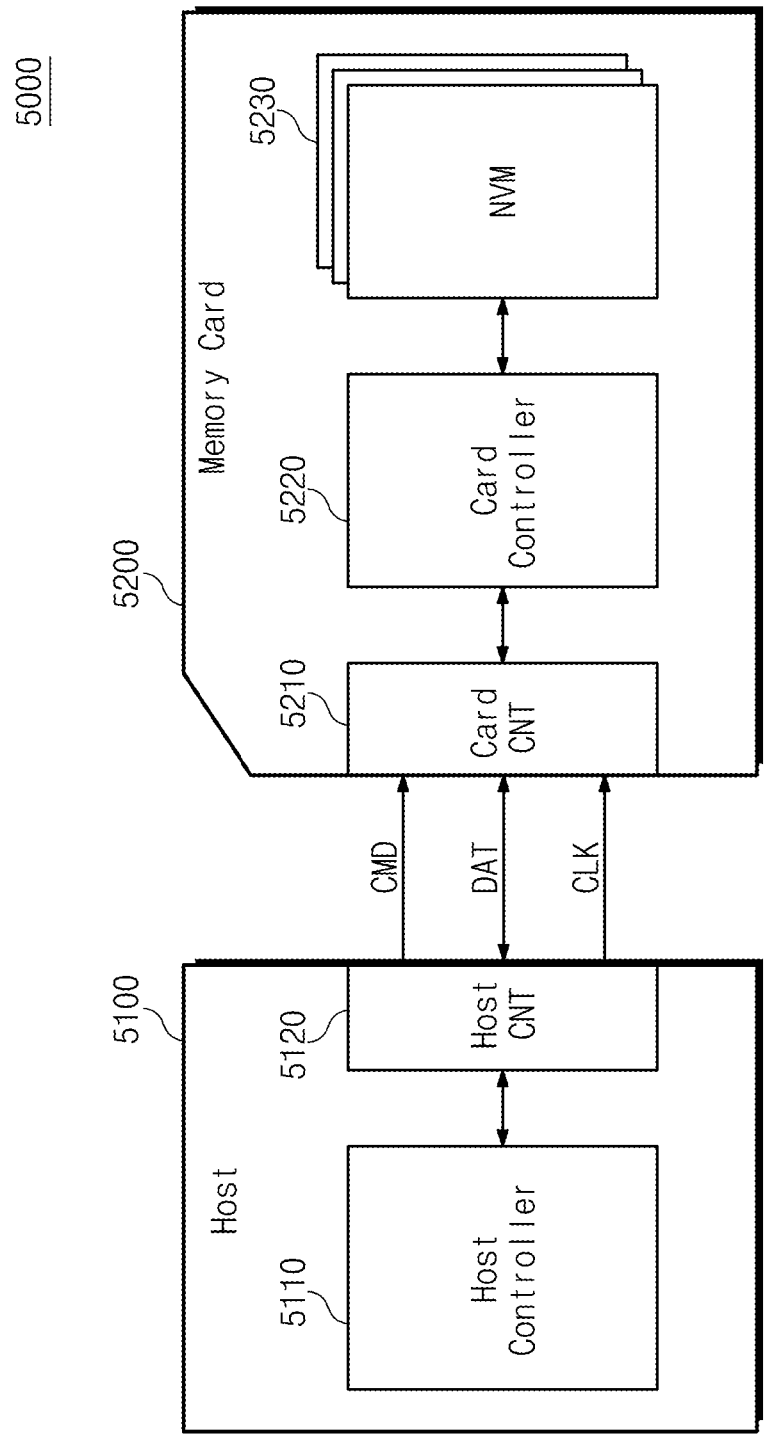
FIG. 9 is a block diagram illustrating a memory card system in accordance with exemplary embodiments of the inventive concept.

FIG. 9 is a block diagram illustrating a memory card system 5000 in accordance with exemplary embodiments of the inventive concept. Referring to FIG. 9, memory card system 5000 may include a host 5100 and a memory card 5200. Host 5100 may include a host controller 5110 and a host connection unit 5120. Memory card 5200 may include a card connection unit 5210, a card controller 5220 and a plurality of nonvolatile memory devices 5230.

Host connection unit 5120 and card connection unit 5210 are constituted by a plurality of pins. The pins may include a command pin, a data pin, a clock pin, a power pin, etc. The number of pins may be different depending on the type of memory card 5200. For example, an SD card has 9 pins.

Host 5100 writes data in memory card 5200 or reads data stored in memory card 5200. Host controller 5110 transmits a command (e.g., a write command), a clock signal (CLK) generated from a clock generator (not illustrated) in host 5100 and data (DAT) to memory card 5200 through host connection unit 5120.

Card controller 5220 responds to a write command received through card connection unit 5210 and stores data in the plurality of nonvolatile memory devices 5230 in synchronization with a clock signal (CLK) generated from a clock generator (not illustrated). The plurality of nonvolatile memory devices 5230 stores data transmitted from host 5100. For example, if host 5100 is a digital camera, it stores video data.

Card controller 5220 transmits and receives input/output signals to/from the plurality of nonvolatile memory devices 5230. At this time, a command, an address and data are transmitted and received between card controller 5220 and each of nonvolatile memory devices 5230 through those input/output signals.

According to exemplary embodiments of the inventive concept, input/output terminals are swapped between card controller 5220 and at least one of nonvolatile memory devices 5230 to be connected to each other. Card controller 5220 or each of nonvolatile memory devices 5230 includes an input/output path swap unit swapping an internal input/output path. Card controller 5220 may include an input/output signal processing module swapping input/output signals being transmitted to the nonvolatile memory device and being received from the nonvolatile memory device of which input/output terminals are swapped for card controller 5220 to be connected to card controller 5220 instead of the input/output path swap unit.

Figure 10:
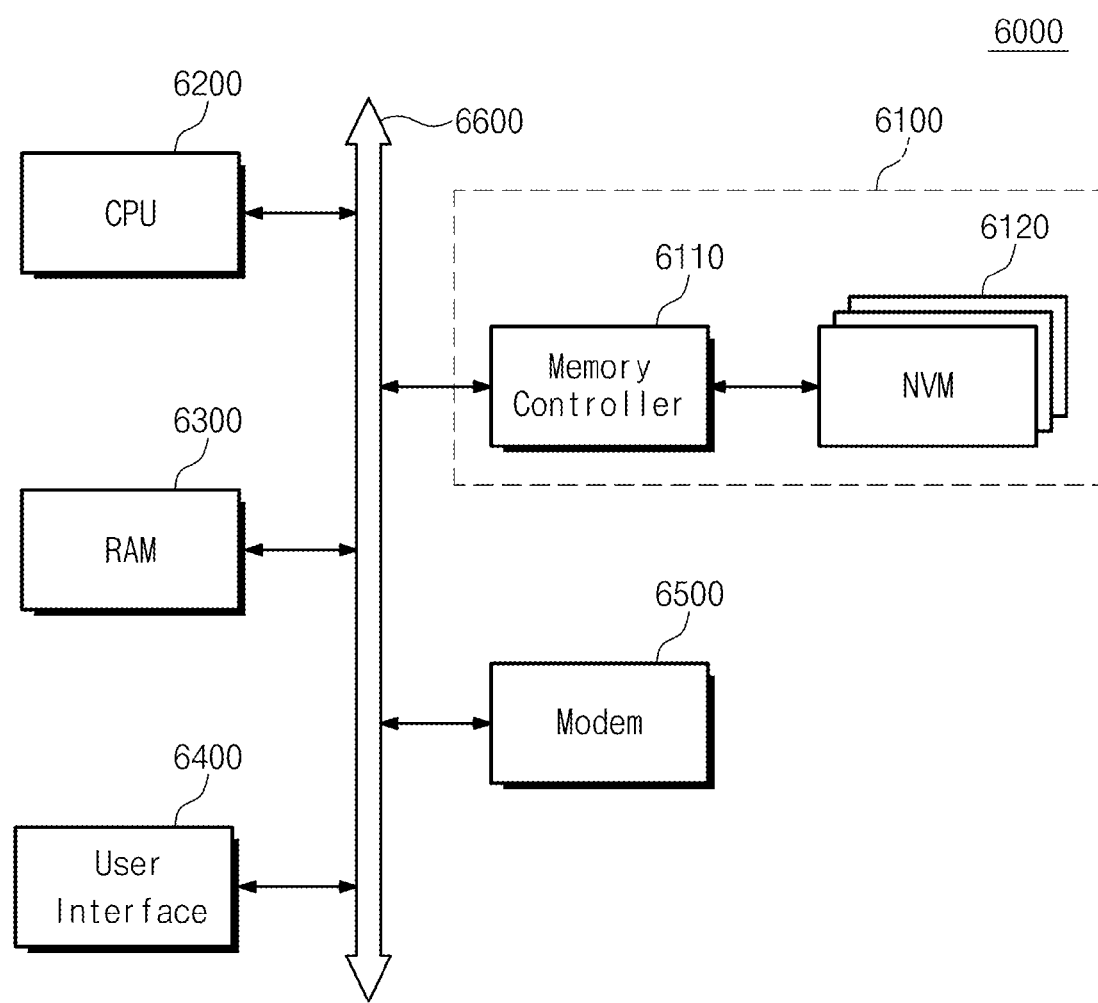
FIG. 10 is a block diagram illustrating a computing system in accordance with exemplary embodiments of the inventive concept.

FIG. 10 is a block diagram illustrating a computing system 6000 in accordance with exemplary embodiments of the inventive concept. Referring to FIG. 10, computing system 6000 in accordance with exemplary embodiments of the inventive concept may include a memory system 6100, a micro processor 6200, a RAM 6300, a user interface 6400, a modem 6500 such as a baseband chipset and a system bus 6600. In the case that computing system 6000 is a mobile device, a battery (not illustrated) to apply an operation voltage of computing system 6000 may be further included. Although not illustrated in the drawing, computing system 6000 may further include an application chipset, a camera image processor (CIS), a mobile DRAM, etc.

Memory system 6100 may include a memory controller 6110 and a plurality of nonvolatile devices 6120. Herein, memory system 6100 may be constituted to be the same with that illustrated in FIG. 1, 3 or 7. Memory system 6000 may be applied to a solid state drive (SSD) using a nonvolatile memory device to store data.

The controller and/or the memory device in accordance with exemplary embodiments of the inventive concept can be mounted with various types of packages. For example, the controller and/or the memory device can be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted.

According to the memory system in accordance with exemplary embodiments of the inventive concept, a routing with regard to memory devices being mounted on a printed circuit board (PCB) by an input/output path swap may be easily done. That is, an interconnection efficiency of the PCB may be increased. Also, since a length of stub to connect the memory devices is reduced, signal integrity (SI) may be improved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A memory system comprising:
a first memory device having first and second input/output terminals;
a second memory device having first and second input/output terminals; and
a controller having first and second input/output terminals,
wherein the first and second input/output terminals of the controller are connected respectively to the second and first input/output terminals of the first memory device, and are connected respectively to the first and second input/output terminals of the second memory device,
wherein the controller is configured to rearrange input/output signals being communicated with the first memory device such that first and second input/output signals which are communicated to the second memory device via the first and second input/output terminals of the controller, respectively, are communicated to the first memory device via the second and first input/output terminals of the controller, respectively.

2. The memory system of claim 1, wherein the controller comprises:
an internal circuit generating first and second chip enable signals controlling an access to the first and second memory devices respectively;
an input/output pad unit connected to the first and second terminals of the controller; and
an input/output path swap unit connected between the internal circuit and the input/output pad unit,
where the input/output path swap unit is configured to select a first internal input/output path between the internal circuit and the input/output pad in response to the first chip enable signal and to select a second internal input/output path between the internal circuit and the input/output pad in response to the second chip enable signal.

3. The memory system of claim 2, wherein the input/output path swap unit comprises:
a swap control circuit generating a select signal in response to the first and second chip enable signals; and a path select circuit selecting one of the first and second input/output paths according to a login level of the select signal.

4. The memory system of claim 1, wherein the controller comprises:
an internal circuit having first and second input/output terminals;
an input/output pad unit comprising first and second input/output pads corresponding to the first and second input/output terminals of the controller respectively; and
an input/output path swap unit connecting the first and second input/output terminals of the internal circuit to the first and second input/output pads,
wherein the input/output path swap unit is configured to connect the first and second input/output terminals of the internal circuit to the first and second input/output pads, respectively, or to connect the first and second input/output terminals of the internal circuit to the second and first input/output pads, respectively, depending on which one between the first and second memory devices is communicating the input/signals with the controller.

5. The memory system of claim 4, wherein the input/output path swap unit comprises:
a swap control circuit generating a select signal in response to first and second chip enable signals controlling an access to the first and second memory devices respectively; and
a path select circuit connecting the first and second input/output terminals of the internal circuit to the first and second input/output pads,
wherein the path select is configured to connect the first and second input/output terminals of the internal circuit to the first and second input/output pads, respectively, or to connect the first and second input/output terminals of the internal circuit to the second and first input/output pads, respectively, depending on a logic level of the select signal.

6. The memory system of claim 5, wherein the input/output path swap unit comprises a register storing routing state information representing a connection state between the controller and the first and second memory devices.

7. The memory system of claim 6, wherein the swap control circuit generates the select signal with reference to the routing state information.

8. The memory system of claim 1, wherein the controller includes firmware comprising an input/output signal processing module configured to selectively swap the first and second input/output signals depending on which one between the first and second memory devices is communicating the first and second input/output signals with the controller.

9. The memory system of claim 8, wherein the input/output signal processing module selectively swaps the first and second input/output signals with reference to device connection information and swap table information.

10. A memory system comprising:
a plurality of memory devices, wherein each of the memory devices includes a corresponding input/output path swap unit configured to selectively swap a first internal input/output path within the corresponding memory device for a second input/output path within the corresponding memory device; and
a controller configured to transmit a control signal and reference data to the memory devices,
wherein one of the input/output path swap units included in one of the memory devices is configured to selectively swap the first internal input/output path within the corresponding memory device for the second input/output path within the corresponding memory device according to whether the reference data received by the one memory device coincides with internal reference data stored within the one memory device.

11. The memory system of claim 10, wherein the one input/output path swap unit maintains the first internal input/output path when the received reference data coincides with the internal reference data, and swaps the first internal input/output path for the second input/output path when the received reference data does not coincide with the internal reference data.

12. The memory system of claim 10, wherein the one memory device comprises:
an input/output pad unit comprising first and second input/output pads; and
an input/output buffer unit comprising first and second input/output buffers corresponding to the first and second input/output pads respectively,
wherein when the received reference data does not coincide with the internal reference data, the input/output path swap unit connects the first and second input/output pads to the second and first input/output buffers respectively, and when the received reference data coincides with the internal reference data, the input/output path swap unit connects the first and second input/output pads to the corresponding first and second input/output buffers respectively, the input/output path swap unit being connected between the input/output pad unit and the input/output buffer unit.

13. The memory system of claim 12, wherein the input/output path swap unit comprises:
a swap control circuit generating a select signal in response to the control signal; and
a path select circuit connecting the first and second input/output pads of the internal circuit to the first and second input/output buffers by connecting the first and second input/output pads of the internal circuit to the second and first input/output buffers, respectively, or connecting the first and second input/output pads of the internal circuit to the corresponding first and second input/output buffers, respectively, depending on a logic level of the select signal.

14. The memory system of claim 13, wherein the path select circuit comprises first and second switches, wherein the first switch selectively connects the first input/output pad to the first input/output buffer or to the second input/output buffer depending on a logic level of the select signal, and the second switch selectively connects the second input/output pad to the first input/output buffer or to the second input/output buffer depending on the logic level of the select signal.

15. The memory system of claim 13, wherein the swap control circuit sets a logic level of the select signal according to whether the received reference data coincides with the internal reference data.

16. A memory system, comprising:
a controller having first and second input/output terminals;
a first memory device having first and second input/output terminals; and
a second memory device having first and second input/output terminals,
wherein at least one of the controller and the first memory device includes path selection means for selectively employing one of the first and second terminals of one of the controller and the first memory device for communicating a first input/output signal between the controller and the first memory device and employing an other one of the first and second terminals of the one of the controller and the first memory device for communicating a second input/output signal between the controller and the first memory device, wherein the path selection means selectively employs the first and second terminals of the one of the controller and the first memory device in accordance with data indicating which of the first terminal and second terminal of the first memory device is connected to the first terminal of the controller and which of the first terminal and second terminal of the first memory device is connected to the second terminal of the controller.

17. The memory system of claim 16, wherein the path selection means comprises an input/output path swap unit in the controller.

18. The memory system of claim 17, wherein the data comprises routing state information stored in a register in the controller.

19. The memory system of claim 16, wherein the path selection means comprises an input/output signal processing module configured to swap the first and second input/output signals in response to the data indicating that the second terminal of the first memory device is connected to the first terminal of the controller and the first terminal of the first memory device is connected to the second terminal of the controller.

20. The memory system of claim 16, wherein the path selection means comprises an input/output path swap unit in the first memory device.

* * * * *